(12) United States Patent
Thompson et al.

(10) Patent No.: US 6,873,211 B1
(45) Date of Patent: Mar. 29, 2005

(54) MULTI-MODE BIAS CIRCUIT FOR POWER AMPLIFIERS

(75) Inventors: Philip H. Thompson, Solon, IA (US); Michael L. Hageman, Mt. Vernon, IA (US); Grant Small, Hiawatha, IA (US); Terry J. Shie, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/660,154

(22) Filed: Sep. 10, 2003

(51) Int. Cl.[7] .............................................. H03G 3/10
(52) U.S. Cl. ...................................... 330/285; 330/296
(58) Field of Search .............................. 330/285, 296, 330/51, 288, 302; 323/315, 316

(56) References Cited

U.S. PATENT DOCUMENTS

| | | | |
|---|---|---|---|
| 6,359,516 B1 * | 3/2002 | Luo et al. | 330/296 |
| 6,414,553 B1 * | 7/2002 | Luo | 330/296 |
| 6,515,546 B2 * | 2/2003 | Liwinski | 330/296 |
| 6,744,321 B2 * | 6/2004 | Noh et al. | 330/296 |

* cited by examiner

*Primary Examiner*—Henry Choe
(74) *Attorney, Agent, or Firm*—Farjami & Farjami LLP

(57) ABSTRACT

According to an exemplary embodiment, a circuit arrangement includes a multi-mode bias circuit having a control voltage input, a mode control input for selecting between a linear mode and a saturation mode, and a bias output. The circuit arrangement further includes an amplifier having a bias input connected to the bias output of the multi-mode bias circuit, the amplifier having an RF input and an RF output. The multi-mode bias circuit causes the amplifier RF output power to be proportional to the RF input power when the mode control input selects the linear mode. Conversely, the multi-mode bias circuit causes the amplifier RF output power to be determined by the voltage at the control voltage input when the mode control input selects the saturation mode.

20 Claims, 3 Drawing Sheets

MULTI-MODE BIAS CIRCUIT FOR POWER AMPLIFIERS

BACKGROUND OF THE INVENTION

1. Field of the Invention

The present invention is generally in the field of communications devices. More specifically, the invention is in the field of power amplifiers for communications devices.

2. Related Art

Wireless communication devices, such as cellular handsets, generally utilize two classes of power amplifiers ("PA"): linear PAs, where output power is controlled by input power; and saturated PAs, where input power is constant and output power is controlled by a control voltage, such as an analog power control voltage ("voltage for analog power control" or "VAPC"). Linear PAs are used in, for example, cellular handsets using code-division multiple access ("CDMA") wireless communication standard. Cellular handsets using global system for mobile communications ("GSM") wireless communication standard that use the enhanced data through GSM evolution ("EDGE") modulation format also require a linear PA.

To ensure proper linear operation, a linear PA requires an appropriate DC bias, which can be provided by using a conventional current mirror circuit including a current source, a reference transistor, and a voltage follower transistor. In a PA comprising a radio frequency ("RF") output transistor, a base-emitter voltage can be provided at the base of the RF output transistor by coupling the base of the RF output transistor to the base of the reference transistor and utilizing the current source to inject a known current into the collector of the reference transistor. The voltage follower transistor, which is coupled to the bases of the reference and RF output transistors, provides the necessary base current to the reference transistor and the RF output transistor. As a result, a constant DC bias is generated by the conventional current mirror circuit to appropriately bias the linear PA. In the linear PA discussed above, the output power of the RF output transistor is proportional to the input power of an RF input signal coupled to the base of the RF output transistor.

Saturated PAs are used in, for example, cellular handsets using a GSM wireless communication standard that utilizes Gaussian minimum shift keying ("GMSK") modulation. In a saturated PA, the phase of RF input signal is varied to transmit information while the power of the RF input signal is held constant. In a saturated PA comprising an RF output transistor, DC bias can be provided by a bias circuit comprising a control voltage, such as VAPC, coupled to the base of the RF output transistor via a resistor. In the saturated PA, the output power of the RF output transistor is a monotonic function of VAPC applied to the base of the RF output transistor.

As discussed above, the saturated PA and the linear PA each require a different bias circuit. However, it is desirable for a PA to be able to operate in both a saturated mode and a linear mode to support multi-mode wireless applications.

Thus, there is a need in the art for a low-cost, easy to implement bias circuit that can effectively support both linear and saturated operating modes of a power amplifier.

SUMMARY OF THE INVENTION

The present invention is directed to multi-mode bias circuits for power amplifiers. The present invention addresses and resolves the need in the art for a low-cost, easy to implement bias circuit that can effectively support both linear and saturated operating modes of a power amplifier.

According to an exemplary embodiment, a circuit arrangement includes a multi-mode bias circuit having a control voltage input, a mode control input for selecting between a linear mode and a saturation mode, and a bias output. The circuit arrangement further includes an amplifier having a bias input connected to the bias output of the multi-mode bias circuit, the amplifier having an RF input and an RF output. The multi-mode bias circuit causes the amplifier RF output power to be proportional to the RF input power when the mode control input selects the linear mode. Conversely, the multi-mode bias circuit causes the amplifier RF output power to be determined by the voltage at the control voltage input when the mode control input selects the saturation mode.

In one embodiment, the mode control input is connected to a controlled current source utilized in the multi-mode bias circuit. The mode control input enables the controlled current source in the linear mode and disables the controlled current source in the saturation mode. In one embodiment, the mode control input is connected to a switch, the switch being coupled to the control voltage input. The mode control input closes the switch in the saturation mode, thus allowing the control voltage input to determine the bias output of the multi-mode bias circuit in the saturation mode; and the mode control input opens the switch in the linear mode, thus allowing the controlled current source to determine the bias output of the multi-mode bias circuit in the linear mode.

Other features and advantages of the present invention will become more readily apparent to those of ordinary skill in the art after reviewing the following detailed description and accompanying drawings.

DETAILED DESCRIPTION OF THE INVENTION

The present invention is directed to multi-mode bias circuits for power amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. The present invention applies to a multi-mode bias circuit for power amplifiers used in wireless communication devices, such as cellular handsets, using different wireless communication standards, such as CDMA, time-division multiple access ("TDMA"), and GSM.

Figure 1:
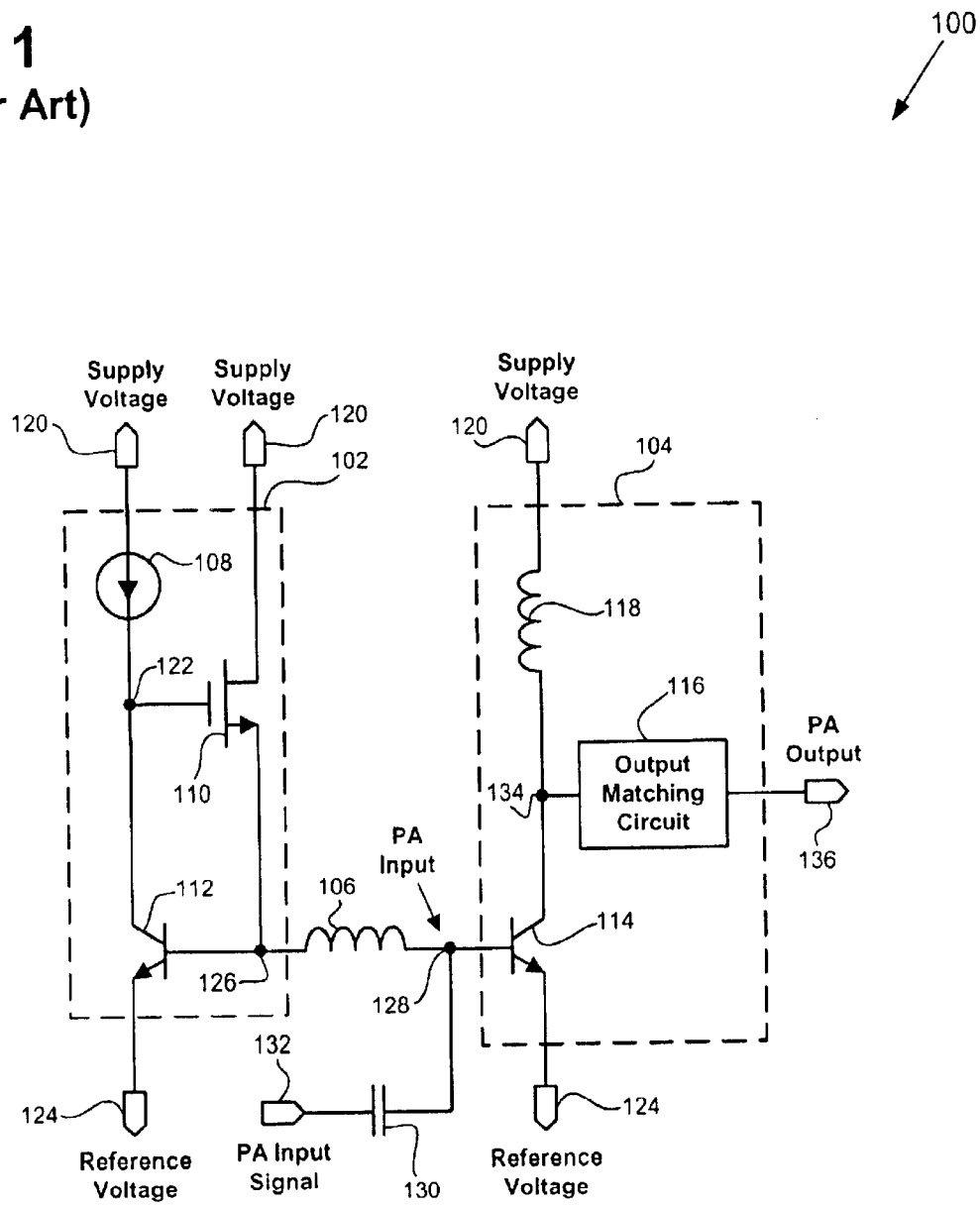
FIG. 1 illustrates a circuit diagram of an exemplary conventional linear mode bias circuit coupled to a power amplifier.

FIG. 1 shows circuit diagram of an exemplary conventional linear mode bias circuit coupled to an exemplary PA. In circuit diagram 100, linear mode bias circuit 102 is coupled to PA 104 via inductor 106. Linear mode bias circuit 102 includes current source 108 and transistors 110 and 112 and PA 104 includes transistor 114, output matching circuit 116, and inductor 118.

As shown in FIG. 1, a first terminal of current source 108 is coupled to supply voltage 120 and a second terminal of current source 108 is coupled to the gate of transistor 110 and the collector of transistor 112 at node 122. Supply voltage 120 may be a supply voltage having a constant DC voltage with no AC component, such as VDD. In the present application, VDD generally refers to the voltage at the positive terminal of a DC power supply, typically a battery's positive terminal. Current source 108 provides a constant current into the collector of transistor 112, which can be an NPN bipolar transistor. Transistor 110 can be, for example, an N-channel field effect transistor ("NFET"). Also shown in FIG. 1, the emitter of transistor 112 is coupled to reference voltage 124, which can be a ground voltage ("ground").

Further shown in FIG. 1, the base of transistor 112 is coupled to the source of transistor 110 and a first terminal of inductor 106 at node 126. Inductor 106 can be, for example, an RF choke. The drain of transistor 110 is coupled to supply voltage 120. Also shown in FIG. 1, a second terminal of inductor 106 is coupled to a first terminal of capacitor 130 and the base of transistor 114 at node 128, which is also referred to as "PA input" in the present application. Transistor 114 is configured to operate as a power amplifier and can be, for example, an NPN transistor. The second terminal of capacitor 130 is coupled to PA input signal 132, which can be an RF signal.

Also shown in FIG. 1, the collector of transistor 114 is coupled to a first terminal of inductor 118 and a first terminal of output matching circuit 116 at node 134. Output matching circuit 116 provides impedance matching between the collector of transistor 114 and an output circuit (not shown in FIG. 1) coupled to PA output 136. A second terminal of inductor 118 is coupled to supply voltage 120. Further shown in FIG. 1, the emitter of transistor 114 is coupled to reference voltage 124.

The function and operation of linear mode bias circuit 102 will now be discussed. Current source 108 inputs a controlled current into the collector of transistor 112, which causes transistor 112 to have a corresponding base-emitter voltage. Since the base of transistor 114 is coupled to the base of transistor 112, the base-emitter voltage of transistor 112 is also applied to transistor 114, which causes a collector current to flow in transistor 114 that is proportional to the collector current in transistor 112. Base current is provided to transistors 112 and 114 from supply voltage 120 via transistor 110, which is coupled to the base of transistor 112 and transistor 114 at node 126. Thus, bias circuit 102 generates a constant DC bias at the base of transistor 114, which enables PA 104 to operate in a linear mode. Thus, since DC bias is constant, i.e. has a fixed voltage, in linear mode, the power output of PA 104 at PA output 136 is proportional to the input power provided by PA input signal 132 at the PA input.

Figure 2:
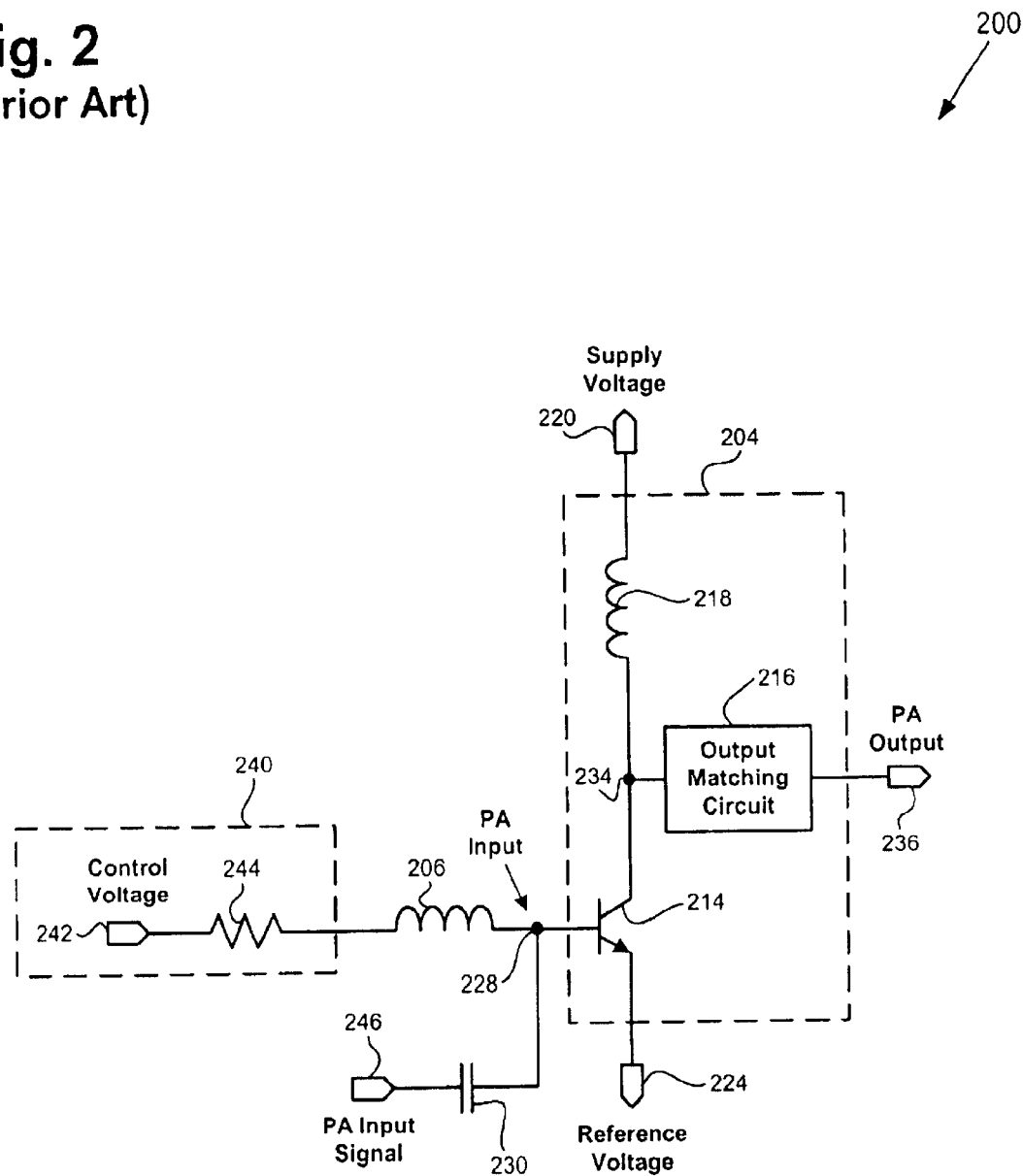
FIG. 2 illustrates a circuit diagram of an exemplary conventional saturated mode bias circuit coupled to a power amplifier.

FIG. 2 shows a circuit diagram of an exemplary conventional saturated mode bias circuit coupled to an exemplary PA. In FIG. 2, PA 204, inductor 206, and capacitor 230 in circuit diagram 200 correspond, respectively, to PA 104, inductor 106, and capacitor 130 in circuit diagram 100 in FIG. 1. In circuit diagram 200, saturated mode bias circuit 240 includes control voltage 242 and resistor 244.

As shown in FIG. 2, control voltage 242 is coupled to the PA input at node 228 by the series combination of resistor 244 and inductor 206. Control voltage 242 can be an analog control voltage, such as VAPC. PA input signal 246, which can be an RF signal, is also coupled to the PA input at node 228 via capacitor 230. Also shown in FIG. 2, the base of transistor 214, i.e. an output transistor, is coupled to the PA input at node 228, the emitter of transistor 214 is coupled to reference voltage 224, and the collector of transistor 214 is coupled to a first terminal of inductor 218 and a first terminal of impedance matching circuit 216 at node 234. Further shown in FIG. 2, a second terminal of inductor 218 is coupled to supply voltage 220 and a second terminal of impedance matching circuit 216 is coupled to PA output 236.

The function and operation of saturated mode bias circuit 240 will now be discussed. In a saturated mode, a DC bias can be applied to the base of transistor 214, i.e. an output transistor, by control voltage 242, which is coupled to the base of transistor 214 via resistor 244 and inductor 206. Thus, the DC bias at the base of transistor 214 can be controlled by appropriately adjusting control voltage 242 such that PA 204 can operate in saturated mode, where the output power of PA 204 is proportional to control voltage 242.

Figure 3:
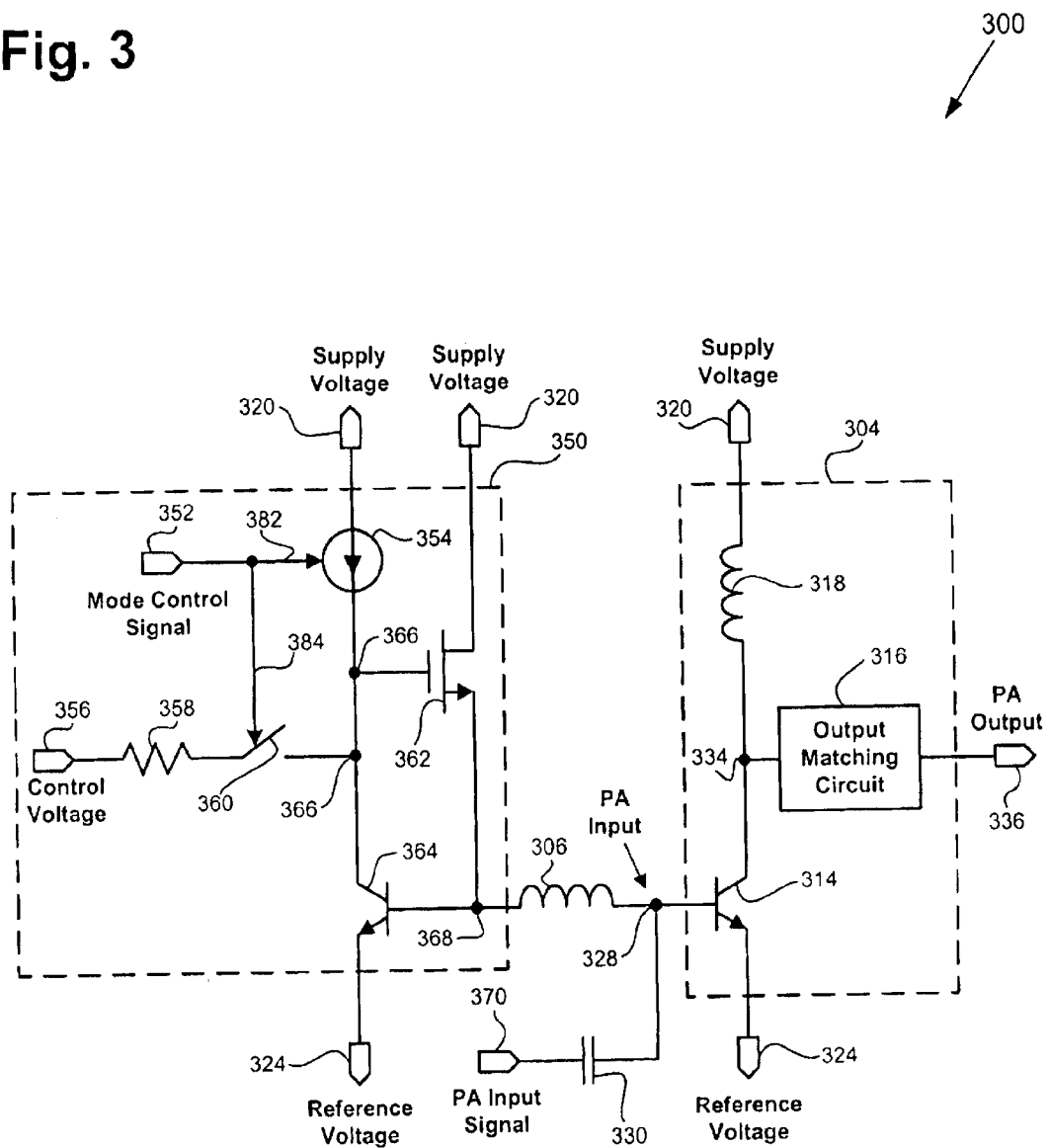
FIG. 3 illustrates a circuit diagram of an exemplary multi-mode bias circuit coupled to an exemplary power amplifier in accordance with one embodiment of the present invention.

FIG. 3 shows a circuit diagram of an exemplary multi-mode mode bias circuit coupled to an exemplary PA in accordance with one embodiment of the present invention. Certain details and features have been left out of FIG. 3, which are apparent to a person of ordinary skill in the art. In circuit diagram 300, multi-mode bias circuit 350 includes mode control signal 352, controlled current source 354, control voltage 356, resistor 358, switch 360, and transistors 362 and 364. PA 304 includes transistor 314, impedance matching circuit 316, and inductor 318 and is configured to operate in a linear mode and in a saturated mode. Although PA 304 is shown as having only a single PA stage, i.e. transistor 314, for simplicity of illustration, PA 304 can have any number of PA stages.

As shown in FIG. 3, mode control signal 352 is coupled to a control terminal of controlled current source 354 through line 382. Mode control signal 352 can be configured to enable controlled current source 354 in a linear mode and disable it, i.e. controlled current source 354, in a saturated mode. Controlled current source 354 can be configured to output a constant current when enabled by controlled current source 354 in the linear mode. Also shown in FIG. 3, the input of controlled current source 354 is coupled to supply voltage 320, which can be a reference voltage having a constant DC voltage with no AC current, such as VDD. The output of controlled current source 354 is coupled to the gate of transistor 362, a first terminal of switch 360, and the collector of transistor 364 at node 366. In the present embodiment, transistor 362 can be an NFET and transistor 364 can be an NPN bipolar transistor. Switch 360 can be configured to be in an open position in a linear mode and in a closed, i.e. shorted, position in a saturated mode and can comprise, for example, a complimentary metal-oxide semiconductor ("CMOS") pass gate or other appropriate switching device as known by a person of ordinary skill in the art. As shown in FIG. 3, mode control signal 352 is coupled to, and controls, switch 360 through line 384. Mode control signal 352 can be configured to close switch 360 in a saturated mode and open switch 360 in a linear mode.

Further shown in FIG. 3, control voltage 356 is coupled to a first terminal of resistor 358 and a second terminal of resistor 358 is coupled to a second terminal of switch 360. Also shown in FIG. 3, the drain of transistor 362 is coupled to supply voltage 320 and the source of transistor 362 is coupled to the base of transistor 364 and a first terminal of inductor 306 at node 368. Node 368 provides the DC bias output for operation of PA 304. Inductor 306 can isolate the DC bias outputted by multi-mode bias circuit 350 and an RF input signal at node 328 and can be, for example, an RF choke. Further shown in FIG. 3, the emitter of transistor 364 is coupled to reference voltage 324, which can be, for example, a ground voltage ("ground").

Also shown in FIG. 3, a second terminal of inductor 306 is coupled to a first terminal of capacitor 330 and the base of transistor 314 at node 328, i.e. the PA input of PA 304. Transistor 314 can be, for example, a NPN bipolar transistor or other appropriate transistor. Further shown in FIG. 3, a second terminal of capacitor 330 is coupled to PA input signal 370, which can be, for example, an RF input signal. Also shown in FIG. 3, the emitter of transistor 314 is coupled to reference voltage 324 and the collector of transistor 314 is coupled to a first terminal of inductor 318 and a first terminal of output matching circuit 316 at node 334. Inductor 318 can isolate an amplifier RF signal at node 334 and supply voltage 320, which is coupled to a second terminal of inductor 318, and also provide DC bias to the collector of transistor 314. Output matching circuit 316 provides impedance matching between the collector of transistor 314 and a device, such as an antenna, coupled to PA output 336, which is coupled to a second terminal of output matching circuit 316. PA 304 can be configured to provide an output signal, such as an RF output signal, at PA output 336.

The function and operation of multi-mode bias circuit 350 will now be discussed. In the linear mode, switch 360 is opened and controlled current source 354 is enabled by mode control signal 352. Since transistors 362 and 364 are configured and operate in a similar manner as transistors 110 and 112 in FIG. 1, multi-mode bias circuit 350 operates in a similar manner as linear mode bias circuit 102 discussed above. Thus, similar to linear mode bias circuit 102, multi-mode bias circuit 350 generates a constant DC bias at the base of transistor 314. Thus, since DC bias is constant, i.e. has a fixed voltage, in linear mode, the output power of PA 304 at PA output 336 is proportional to the input power of the input signal, i.e. PA input signal 370. Therefore, in linear mode, the gain of PA 304 is constant with input power.

In the saturated mode, switch 360 is in a closed position and controlled current source 354 is disabled by mode control signal 352. As a result, control voltage 356 is applied to the gate of transistor 362 and the collector of transistor 364 via resistor 358 and switch 360. As control voltage 356 increases, the collector current in transistor 364 increases, which causes a corresponding increase in the base voltage of transistor 364. As a result the collector current in transistor 314 increases since the base of transistor 364 is coupled to the base of transistor 314. Transistor 362, which functions as a voltage follower, allows base current to flow from supply voltage 320 through transistor 362 to the base transistor 314 When an RF input signal with a constant amplitude is applied at PA input 370, the amplitude of the RF output signal will increase as the collector current in transistor 314 increases. Thus, in the saturated mode, the output power of PA 304 at PA output 336 is proportional to the amount of DC bias provided at the base of transistor 314, by control voltage 356, since the input power of PA input signal 370 is held constant. Thus, the gain of PA 304 is proportional to control voltage 356 in the saturated mode.

In other embodiments, transistor 362 could be a bipolar transistor, such as a heterojunction bipolar transistor, instead of a FET as shown in FIG. 3.

Thus, as discussed above, the present invention achieves a multi-mode bias circuit that advantageously supports saturated and linear operating modes of a PA. Also, the present invention provides a multi-mode bias circuit that can easily be switched between saturated and linear modes by controlling a switch and disabling/enabling a current source. Additionally, the present invention's multi-mode bias circuit results in minimal increase in size and cost compared to a conventional linear mode bias circuit, since the additional resistor and switch the present invention requires have a small size and can be integrated on a die without significantly increasing die size.

It is appreciated by the above detailed description that the invention provides a multi-mode bias circuit for power amplifiers that is effective, easy to implement, and cost-effective. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, multi-mode bias circuit for power amplifiers has been described.

What is claimed is:

1. A circuit arrangement comprising:
    a multi-mode bias circuit comprising a control voltage input, a mode control input for selecting between a linear mode and a saturation mode, and a bias output;
    an amplifier comprising a bias input connected to said bias output of said multi-mode bias circuit, said amplifier further comprising an RF input and an RF output;
    said multi-mode bias circuit causing an RF output power at said RF output to be proportional to an RF input power at said RF input when said mode control input selects said linear mode;
    said multi-mode bias circuit causing an RF output power at said RF output to be determined by said control voltage input when said mode control input selects said saturation mode.

2. The circuit arrangement of claim 1 wherein said mode control input is coupled to a controlled current source for enabling said controlled current source in said linear mode and for disabling said controlled current source in said saturation mode.

3. The circuit arrangement of claim 1 wherein mode control input is coupled to a switch, said switch enabling a path between said control voltage input and said bias output of said multi-mode bias circuit in said saturation mode, said switch disabling a path between said control voltage input and said bias output of said multi-mode bias circuit in said linear mode.

4. The circuit arrangement of claim 3 wherein said path comprises a transistor situated between said switch and said bias output of said multi-mode bias circuit.

5. The circuit arrangement of claim 4 wherein said transistor is a FET configured as a voltage follower transistor, wherein a gate of said FET is coupled to said switch and a source of said FET is coupled to said bias output of said multi-mode bias circuit.

6. The circuit arrangement of claim 1 wherein said multi-mode bias circuit comprises a controlled current source coupled between VDD and a gate of a FET, said gate of said FET being coupled to a switch, said switch being coupled to said control voltage input, a drain of said FET being coupled to VDD, a source of said FET being said bias output of said multi-mode bias circuit.

7. The circuit arrangement of claim 6 wherein said multi-mode bias circuit further comprises a bipolar transistor having a collector coupled to said gate of said FET, an emitter coupled to ground, and a base coupled to said source of said FET.

8. The circuit arrangement of claim 6 wherein said mode control input is coupled to said controlled current source for enabling said controlled current source in said linear mode and for disabling said controlled current source in said saturation mode.

9. The circuit arrangement of claim 6 wherein mode control input is coupled to said switch, said mode control input closing said switch in said saturation mode, said mode control input opening said switch in said linear mode.

10. The circuit arrangement of claim 6 further comprising a resistor between said control voltage input and said switch.

11. A circuit comprising:
a biasing means for causing an amplifier to operate in a linear mode or a saturation mode;
said biasing means comprising a controlled current source, said controlled current source being enabled in said linear mode and being disabled in said saturation mode;
said biasing means further comprising a switch coupled to a control voltage input, said switch being closed in said saturation mode and being open in said linear mode.

12. The circuit of claim 11 wherein a mode control input selects between said linear mode and said saturation mode.

13. The circuit of claim 12 wherein said mode control input enables said controlled current source in said linear mode and disables said controlled current source in said saturation mode.

14. The circuit of claim 12 wherein said mode control input closes said switch in said saturation mode and opens said switch in said linear mode.

15. The circuit of claim 11 wherein a bias output of said biasing means is connected to a bias input of said amplifier.

16. A circuit comprising:
a biasing means for causing an amplifier to operate in a linear mode or a saturation mode;
said biasing means comprising a controlled current source, said controlled current source coupled to a gate of a transistor, said controlled current source being enabled in said linear mode;
said biasing means further comprising a control voltage input, said control voltage input coupled to said gate of said transistor in said saturation mode;
wherein a source of said transistor is a bias output of said biasing means.

17. The circuit of claim 16 wherein a mode control input selects between said linear mode and said saturation mode.

18. The circuit of claim 17 wherein said mode control input is coupled to said controlled current source so as to enable said current source in said linear mode and to disable said controlled current source in said saturation mode.

19. The circuit of claim 17 wherein said biasing means further comprises a switch between said control voltage input and said gate of said transistor, wherein said mode control input is coupled to said switch, said mode control input closing said switch in said saturation mode and opening said switch in said linear mode.

20. The circuit of claim 19 further comprising a resistor between said switch and said control voltage input.

* * * * *